United States Patent [19]

Gorelik

[11] Patent Number: 5,546,417
[45] Date of Patent: Aug. 13, 1996

[54] SEMICONDUCTOR ARCHITECTURE AND APPLICATION THEREOF

[75] Inventor: Vladimir Gorelik, Savannah, Ga.

[73] Assignee: Integrated Data Systems, Inc. Stephen Krissman, Savannah, Ga.

[21] Appl. No.: 330,309

[22] Filed: Oct. 27, 1994

Related U.S. Application Data

[63] Continuation of Ser. No. 947,410, Sep. 18, 1992, Pat. No. 5,361,272.

[51] Int. Cl.$^6$ .............................. H01S 3/19; H01S 3/045
[52] U.S. Cl. .................. 372/36; 257/80; 372/109
[58] Field of Search ........................ 372/36, 109, 703, 372/75; 257/80, 81, 82

[56] References Cited

U.S. PATENT DOCUMENTS

| | | | |
|---|---|---|---|
| 3,441,742 | 4/1969 | Bevis | 250/239 |
| 3,562,582 | 2/1971 | Broyles | 315/153 |
| 3,621,256 | 11/1971 | Cacheaux et al. | 250/83 |
| 3,683,296 | 8/1972 | Scalise | 372/36 |
| 3,711,789 | 1/1973 | Dierchke | 331/94.5 P |
| 3,875,404 | 4/1975 | Fletcher et al. | 250/211 |
| 4,063,083 | 12/1977 | Cathey et al. | 250/199 |
| 4,499,607 | 2/1985 | Higgins | 455/606 |
| 4,499,608 | 2/1985 | Broockman et al. | 455/607 |
| 4,551,787 | 11/1985 | Mittal et al. | 361/387 |
| 4,564,866 | 1/1986 | Comberg | 358/302 |
| 4,590,538 | 5/1986 | Cray, Jr. | 361/385 |
| 4,662,714 | 5/1987 | Mori | 350/96.20 |
| 4,682,323 | 7/1987 | Corfield et al. | 370/4 |
| 4,755,681 | 7/1988 | Oka et al. | 250/370.01 |
| 4,838,630 | 6/1989 | Jannson et al. | 350/3.7 |
| 4,841,355 | 6/1989 | Parks | 357/82 |
| 4,850,044 | 7/1989 | Block et al. | 455/607 |
| 4,851,856 | 7/1989 | Altoz | 343/720 |
| 4,893,025 | 1/1990 | Lee | 250/561 |
| 5,067,792 | 11/1991 | Lloyd | 359/32 |
| 5,111,280 | 5/1992 | Iversen | 357/82 |
| 5,113,403 | 5/1992 | Block et al. | 359/152 |
| 5,113,404 | 5/1992 | Gaebe et al. | 372/36 |
| 5,238,531 | 8/1993 | Macomber et al. | 156/643 |

FOREIGN PATENT DOCUMENTS

| | | |
|---|---|---|
| 0176288 | 9/1985 | Japan . |
| 1-293589A | 11/1989 | Japan . |

OTHER PUBLICATIONS

Scifres et al., "Semiconductor Laser with Integral Light Inensity Detector", Appl. Phys. Lett 35(1) 1 Jul. 1979, pp. 16–18.

*Primary Examiner*—James W. Davie
*Attorney, Agent, or Firm*—Troutman Sanders LLP; Joel S. Goldman; Scott M. Frank

[57] ABSTRACT

A new technology in semiconductor electronics is provided wherein basic semiconductor elements (BSEs) are fabricated on the surfaces of hollow, cone-shaped and/or other planar or non-planar substrata. Photosensitive and photo-emitting elements are included within each BSE capable of transmitting and receiving signals to and from external sources in a direction that is non-parallel (oblique) to the silicon surface and circuitry plane. Inter-BSE communication are also achieved via fiber optic connectors. In one embodiment, the BSEs may be assembled in an efficient arrangement whereby some number of BSEs (for example, six (6)) are located adjacent and surrounding another "polar" BSE, thereby providing for short opto-electronic connections between the polar BSE and its neighbors. In additional embodiments, a power supply may reside within the internal space of the BSE, and the interior and exterior of the BSEs are designed as opposite electrical poles, thereby providing power to the BSEs. A highly effective method of cooling may also be provided by transferring coolant within conduits into the interior of each BSE, through the power supply and between the exterior of the internal power supply and the substrata. The present invention may also be applied, in one embodiment, to accept visual information in much the same way as the eye of an animal.

24 Claims, 6 Drawing Sheets

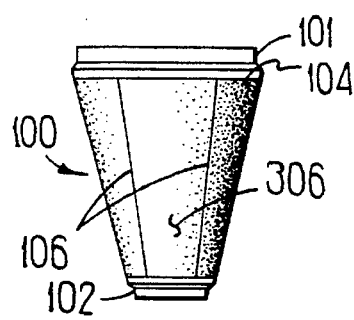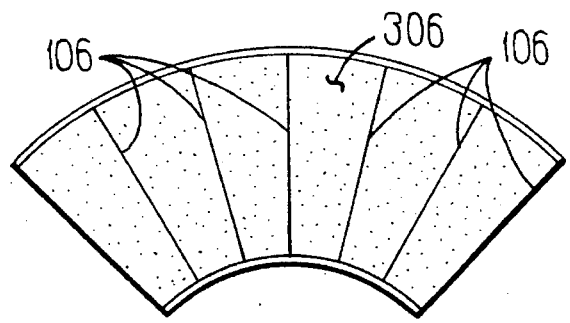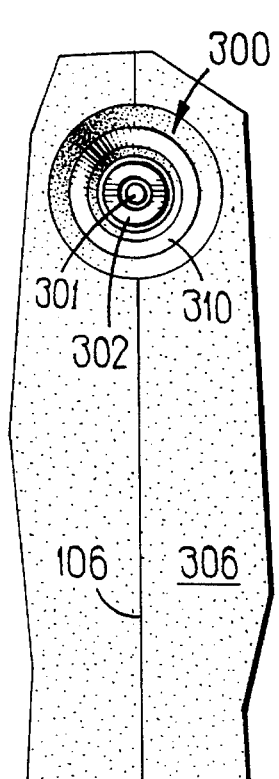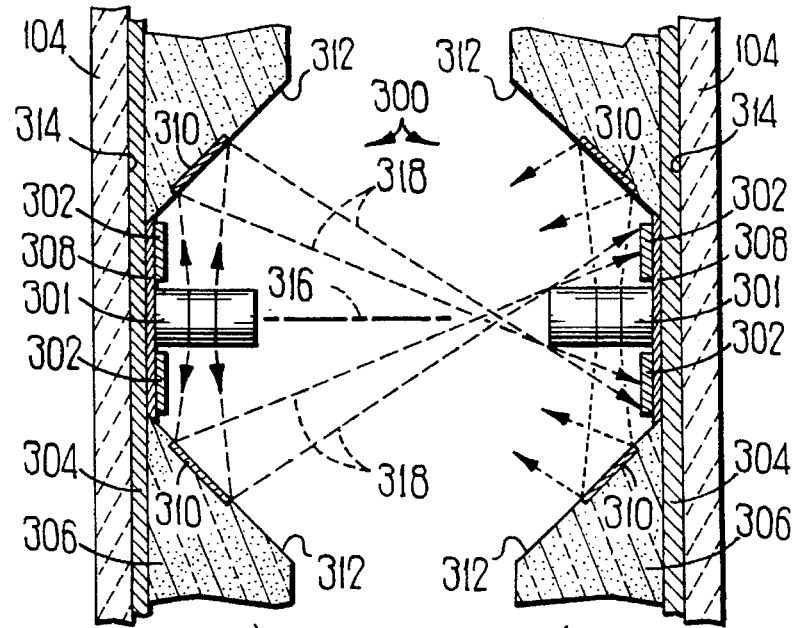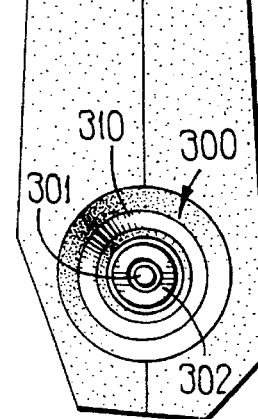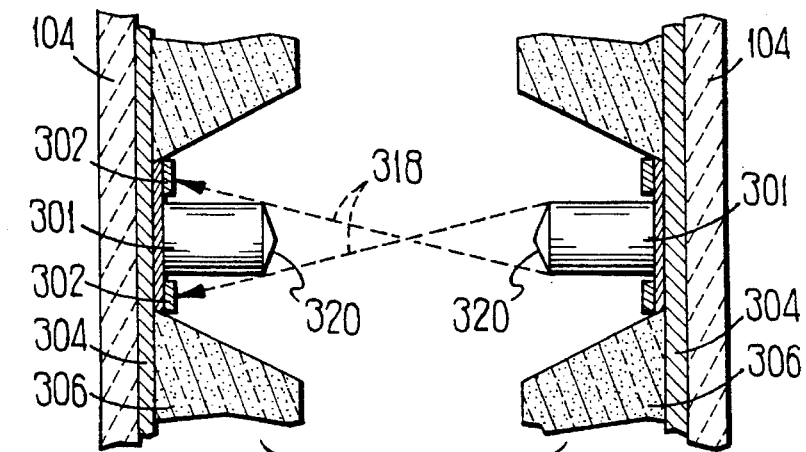

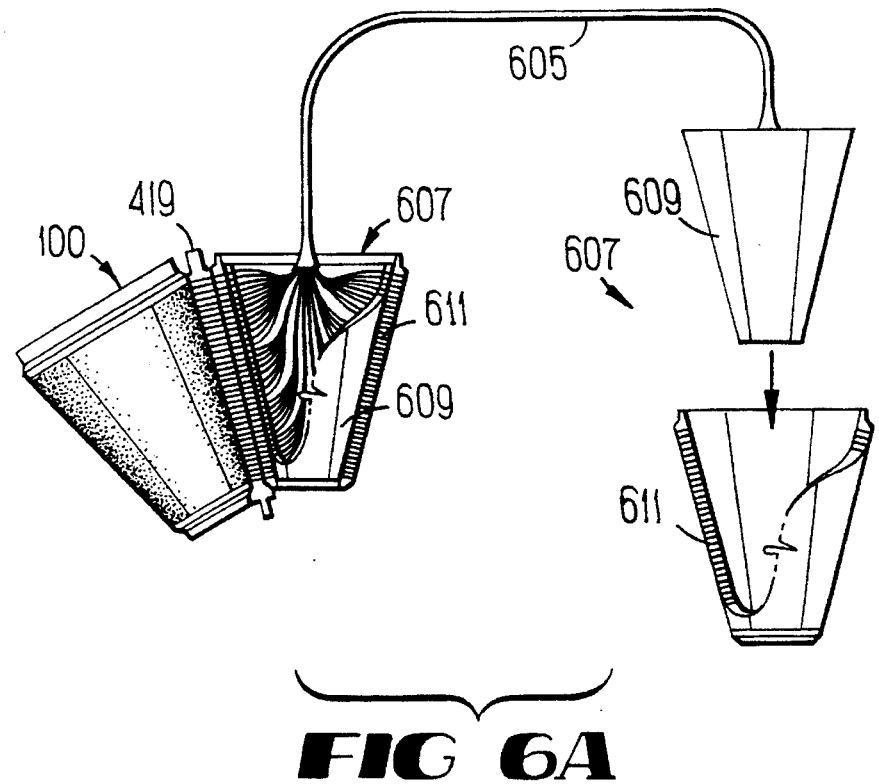
FIG 6A
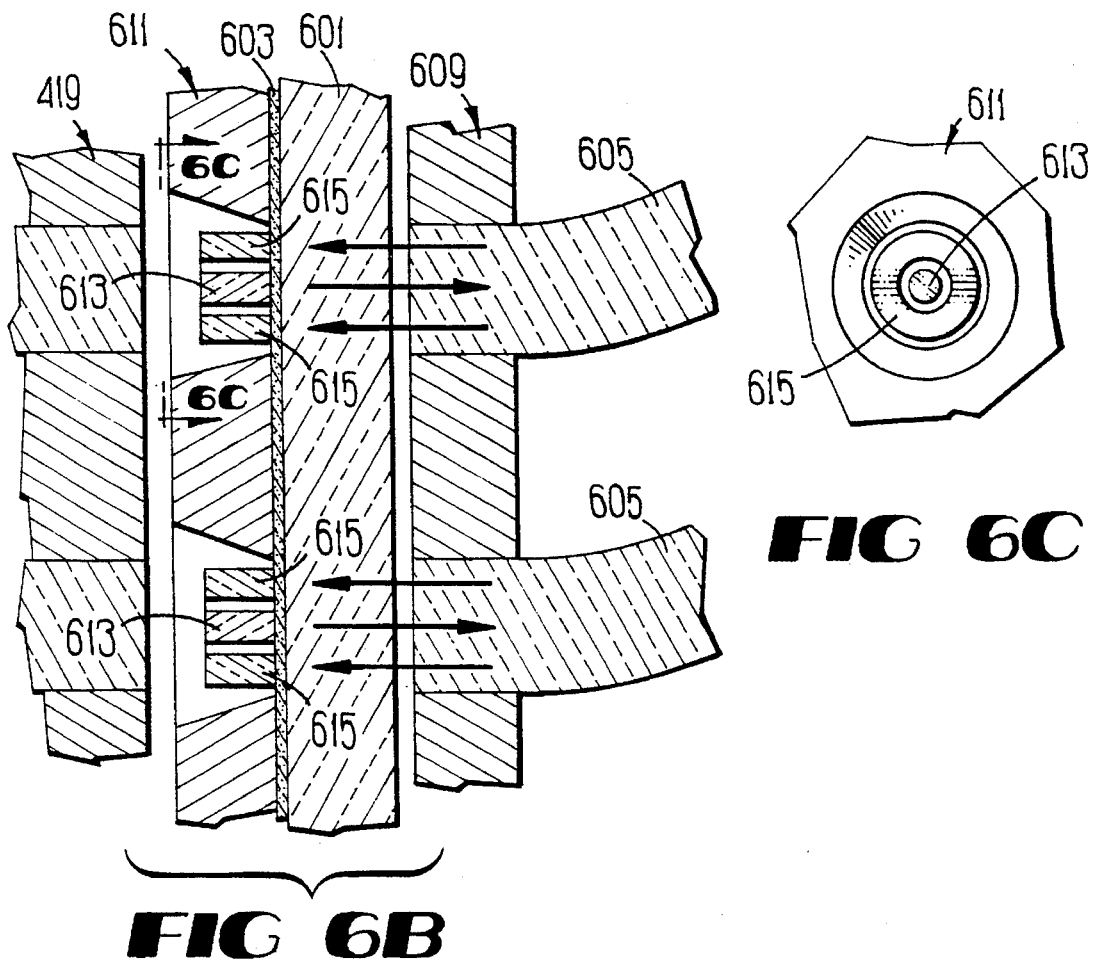
FIG 6B
FIG 6C

SEMICONDUCTOR ARCHITECTURE AND APPLICATION THEREOF

This application is a continuation of application Ser. No. 07/947,410 filed Sep. 18, 1992, now U.S. Pat. No. 5,361,272.

BACKGROUND OF THE INVENTION

1. Technical Field

This invention relates generally to semiconductor technology, and in particular, to a new microelectronic semiconductor technology, advanced computer architecture, special electronic device architecture, and affiliated highly efficient subsystems of cooling and power supply for electronic circuits. Also the invention relates to a multiprocessor network architecture and the methods to achieve maximum data throughput of the network. Finally, the present invention relates to applications of the above technology.

2. Description of the Prior Art

No signals, in any type of media, can propagate faster than the speed of light. The propagation speed of signals in electronic circuitry in conventional media currently cannot exceed one-half this rate due to the factors associated with Resistance/Capacitance (RC) time constants, and this speed is achievable only by applying comparatively large quantities of power by signal transmitters that have to switch greater amounts of current for faster recharging of the electrical capacitance of the conductive media. These large amounts of electrical power create inordinate amounts of heat in both the output switches and conductors, which must be dissipated.

A better method of semiconductor and microchip interconnections is achieved via fiber optics technology since the problems associated with RC time delay do not apply. Although fiber optic interconnections offer some degree of solutions to these problems, it is still necessary to minimize the length of the conduction paths; and this is dependent upon the topology and size of the electronic devices involved. Therefore, in order to increase processing speed, the electronic components must be compressed into an extremely compact arrangement, which also results in the accumulation of an excessive amount of heat that must be dissipated.

Another problem affiliated with such a compact arrangement is that of the creation of unwanted noise, and signal-to-signal and signal-to-power interference resulting from the distribution of comparatively high electric current inside a small volume. These phenomena require special tracing for both power and signal conductors in high frequency circuits.

Most current computer research and development projects proceed along one of two primary directions. One is that used in the manufacture of supercomputers such as CYBER or CRAY, and the other is the design of microsystems based on highly efficient, extremely fast microprocessors similar to INTEL 80486, INTEL I-960 or Motorola MC-68000. Both of these directions are limited, however, by the necessity of short, fast interconnections between large numbers of microchips, boards and units, and cooling requirements of all systems and each individual microchip and power supply.

In most single and multiprocessor systems, all sub-unit interconnections occur through either one, two or occasionally three system buses. Therefore, at a single point in time, no more than two devices (active-bus master and passive-slave) may share a bus, which severely restricts inter-unit communications. This is probably the most consequential limiting factor inherent in conventional computer design in that when the bus is being used by one unit for one function, all other processes are disconnected leaving valuable resources remaining idle.

One of the most recent classes of computational media is based on the "transputers network". A transputer is a special processor, usually based on very large scale integration (VLSI) technology, which has been assigned a set of special instructions and includes input/output circuitry that allows it to be interconnected directly with two or more other transputers, thereby eliminating the need to share the system bus. Usually a transputer network is controlled by a master processor that shares the system bus with other units.

Transputers are designed to-perform specific tasks such as solving a series of differential equations or similar exclusively designated function, the results of which are used by the master processor. In spite of being highly efficient in mathematical processing, transputers retain the same weaknesses inherent in other microchips. They still require a supply of electrical power, a method of heat dissipation, and conventional interconnection with other chips, because the usual method of mounting the chips is on the planar surface of a board.

The above-described shortcomings, and other shortcomings of prior art semiconductor technology, are effectively overcome by the present invention, as described in further detail below.

SUMMARY OF THE INVENTION

It is therefore an object of the present invention to provide an improved and efficient semiconductor technology.

It is another object of the present invention to provide a semiconductor technology having a short time of signal propogation.

It is another object of the present invention to provide a semiconductor technology having short inter-element connections.

It is another object of the present invention to provide a semiconductor technology having fast inter-element connections.

It is another object of the present invention to provide a semiconductor technology allowing for more efficient heat dissipation.

It is another object of the present invention to provide a semiconductor technology having a compact arrangement.

It is another object of the present invention to provide a semiconductor technology having minimal inter-element interference.

It is another object of the present invention to provide a semiconductor technology having an improved power supply system.

It is another object of the present invention to provide a semiconductor technology having an improved cooling system.

It is another object of the present invention to provide a semiconductor technology having an improved topology.

It is another object of the present invention to provide a semiconductor technology having an improved architecture.

It is another object of the present invention to provide an application for the herein-described improved semiconductor technology.

In accordance with the teachings of the present invention, a new technology in semiconductor electronics is provided wherein basic semiconductor elements (BSEs) are fabricated on the surfaces of hollow, cone-shaped and/or other planar or non-planar substrata. Photosensitive and photoemitting elements are included within each BSE capable of transmitting and receiving signals to and from external sources in a direction that is non-parallel (oblique) to the silicon surface and circuitry plane. Inter-BSE communication are also achieved via fiber optic connectors. In one embodiment, the BSEs may be assembled in an efficient arrangement whereby some number of BSEs (for example, six (6)) are located adjacent and surrounding another "polar" BSE, thereby providing for short opto-electronic connections between the polar BSE and its neighbors. In additional embodiments, a power supply may reside within the internal space of the BSE, and the interior and exterior of the BSEs are designed as opposite electrical poles, thereby providing power to the BSEs. A highly effective method of cooling may also be provided by transferring coolant within conduits into the interior of each BSE, through the power supply and between the exterior of the internal power supply and the substrata. The present invention may also be applied, in one embodiment, to accept visual information in much the same way as the eye of an animal.

BRIEF DESCRIPTION OF THE DRAWINGS

FIG. 1 shows a side view of a basic semiconductor element (BSE) having interface lines for interfacing with other BSEs, according to one embodiment of the present invention.

FIG. 2 depicts the development of the surface of the BSE of FIG. 1, according to one embodiment of the present invention.

FIG. 3a shows two photocells on neighboring BSEs, as well as the paths of light travelling between the two photocells, according to one embodiment of the present invention.

FIG. 3b shows two photocells on neighboring BSEs, as well as the paths of light travelling from one photocell to the other photocell, according to one embodiment of the present invention.

FIG. 3c shows a plan view of an interface line shown in FIG. 1, according to one embodiment of the present invention.

FIG. 6 shows one embodiment of an optical interconnector for connecting the BSEs of the present invention.

DETAILED DESCRIPTION OF THE INVENTION

Figure 4:
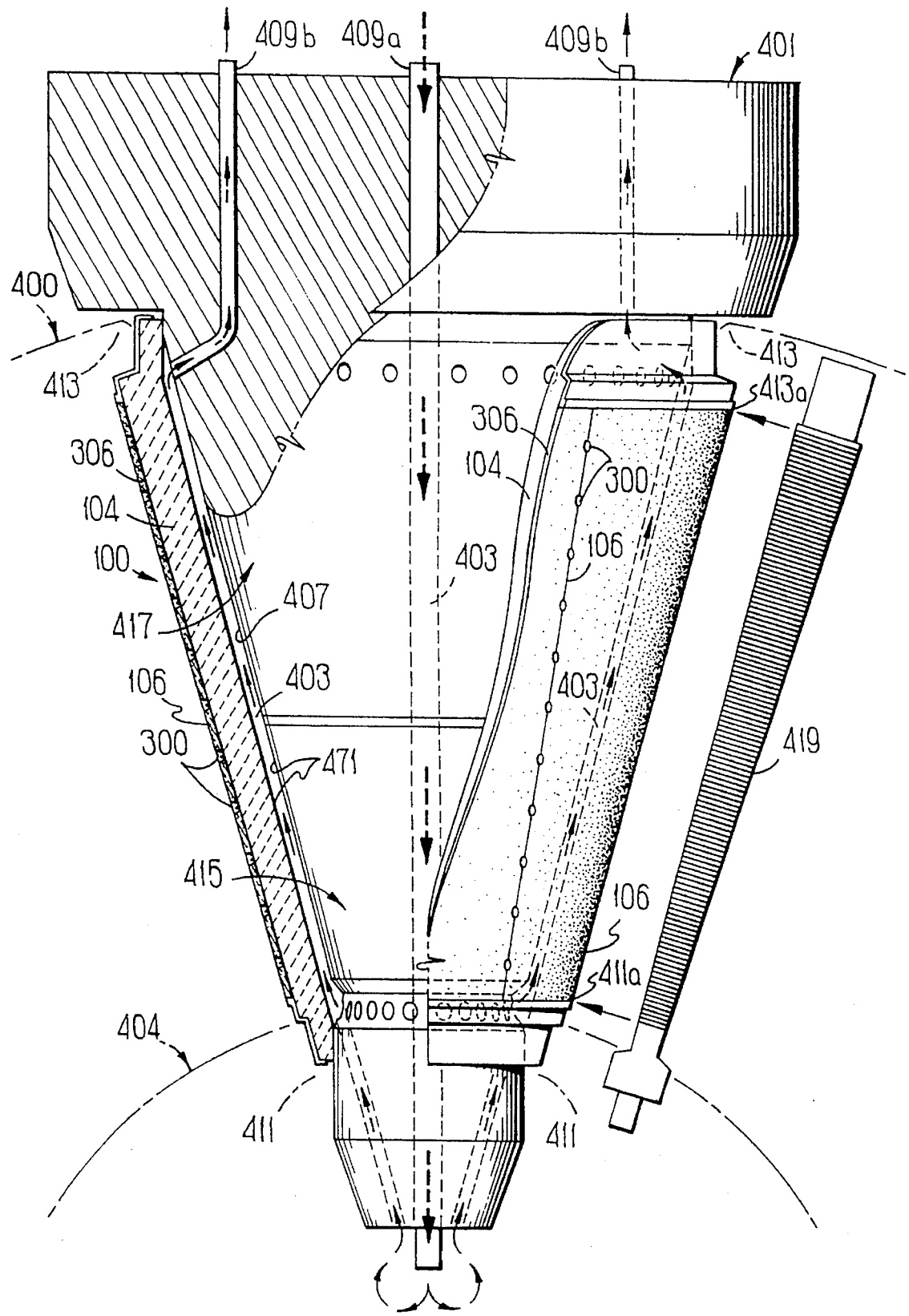
FIG. 4 shows in further detail a BSE according to one embodiment of the present invention.

Referring to FIG. 1, a side view of a basic semiconductor element (BSE) 100 of the present invention is shown. For purposes of example, the particular BSE 100 depicted in FIG. 1 takes the general form of a cone, where both the top 101 and the bottom 102 of BSE 100 form parallel circular rims in different planes, and the sides of BSE 100 taper down from the larger rim to the smaller rim. BSE 100 may also take other planar or non-planar shapes. For example, BSE 100 may comprise a plurality of planar surfaces connected together so as to define a generally non-planar shape. A nearly infinite number of shapes for BSE 100 may be constructed, and it will be understood that the present invention shall not be limited merely by the particular shape of BSE 100.

Electronic circuitry may be grown on the non-planar surface of the cone-shaped substrata 104 of BSE 100. Substrata 104 may be manufactured from materials such as ceramics, pure carbon, silicon dioxide ($SiO_2$) doped to make the crystalline lattice match with the semiconductor lattice, or some other suitable material upon which a layer of semiconductor material can be grown having properties of perfect crystalline lattice structure. This procedure can be divided into two stages, both of which utilize modern crystal growth technologies. Of course, other commonly known methods of growing semiconductor material can be utilized, and the method described below is described as a preferred embodiment only.

In the first stage, a semiconductor buffer layer (reference numeral 304 in FIG. 3a, discussed below) is grown on the surface of substrata 104 by molecular beam epitaxy (MBE) or metal-organic chemical vapor deposition (MOCVD). In one embodiment, the semiconductor buffer layer may be grown to a thickness of 50–100 Angstroms (10–50 monoatomic layers of semiconductor material). It has been shown that no misfit dislocation is generated by the mismatch of the crystalline lattice of dissimilar materials, if the epitaxial layers are sufficiently thin.

The second stage involves a faster growing technique such as hot-wall epitaxy (HWE) or liquid-phase epitaxy (LPE). This stage provides a comparatively faster rate of growth in attaining a 10 mkm layer of semiconductor material (reference numeral 306 in FIG. 3a, discussed below) with suitable lattice quality. This final layer may be grown onto the previously grown buffer layer. In one embodiment, the final layer may be grown over all surfaces of the previously grown buffer layer except specific areas along radial interface lines 106 of BSE 100.

Referring to FIG. 2, radial interface lines 106 may be assigned around the circular periphery of BSE 100 in order to allow BSE 100 to communicate with other basic semiconductor elements (described further below). As shown in FIG. 2, a plurality of these interface lines may be utilized around each BSE 100. In a preferred embodiment, BSE 100 may include six (6) interface lines 106 around its periphery in order to allow it to communicate with six other BSEs. This arrangement will be discussed in further detail below.

A plan view of a portion of the areas along radial interface lines 106 over which the final layer is not grown is depicted in FIG. 3c. Particularly, light generating elements 301 and light receiving elements 302 may be fabricated in these holes or "pockets" 300 during a later stage of manufacture. In a preferred embodiment, pockets 300 may consist of circular areas of approximately 10 mkm diameter spaced 100–300 mkm apart, located along part or all of the length of radial interface lines 106 of BSE 100. Of course, these dimensions are given only for purposes of one embodiment, and it will be readily understood that other suitable dimensions would be appropriate as well. The formation of pockets 300 will now be described in further detail with respect to FIGS. 3a, 3b and 3c.

Referring to FIGS. 3a and 3b, a cut-away cross-section of two BSEs 100 are shown, where the radial interface lines 106 of each BSE 100 are aligned opposite each other. Substrata 104, corresponding to that shown in FIG. 1, forms a part of the cone, or other non-planar surface, upon which the semiconductor material is grown, as previously described. A buffer layer 308 may preferably be grown at the bottom of each of the pockets 300 onto semiconductor buffer layer 304 in order to buffer layer 304 from subsequently grown components, discussed below. Particularly, using MBE technology, a GaAs buffer layer 308, with a perfect lattice structure 1–3 mkm thick, may preferably be grown or otherwise coupled to the bottom of each of the pockets onto the semiconductor buffer layer 304. Photoreceiver cells 302 and photoemitting cells 301 may thereafter be grown on or otherwise coupled to the base of these buffers. In one embodiment, each photoemitting cell 301 may consist of a multi-quantum well surface emitting laser (MQW laser), an edge emitting laser (EE laser) or other equivalent source of light. If EE lasers are used, it may be necessary to create integral mirrors 310 on the surface of the "Pocket" walls 312 to reflect the laser beams in a direction almost normal to the substrata surface 314. In a preferred embodiment, the angle between an integral mirror 310 and the axis 316 of laser 301 must be slightly less than 45 degrees in order to focus the beam onto the surface of the opposite photoreceiver 302 and not onto the top of the opposite laser 301. Reference numeral 318 depicts examples of appropriate paths for the light emitted from laser 301 to travel, so as to hit photoreceivers 302, and not opposite laser 301.

FIG. 3b is similar to FIG. 3a, except that surface emitting lasers 301 (SE lasers) are specifically utilized. If SE lasers are used, special cone shaped splitters 320 may be manufactured on the top surface of SE lasers 301. These splitters 320 are used to effectively direct the path of the light emitted from SE lasers 301 onto photoreceivers 302, rather than onto the opposite lasers 301. Other suitable means for directing the emitted light from other types of photoemitting cells 301 may be used for other types of photoemitting cells.

Each photoemitting cell 301, depicted in either FIGS. 3a, 3b or another equivalent arrangement, is preferably surrounded by a ring-shaped photosensitive element 302 that serves to receive light signals emitted from photoemitting cells 301 from neighboring BSEs 100, and transform these light signals into electric current for further processing. Of course, the above-described photoemitter 301 and photoemitter 302 arrangements are described merely for purposes of example, and it will be readily understood that other equivalent arrangements can be utilized in accordance with the teachings of the present invention.

The unique shape and geometry of BSE 100 allows for the development of faster, more powerful computers and complex electronic devices based upon an original architecture. As discussed in further detail below, an applied design of the present invention provides for unusually large numbers of very short (e.g., less than 2 mm) inter-element connections, and therefore greatly increased inter-element communication speed, without the use of wires, pins or other conventional circuitry. These benefits are made possible by the conical form of the BSE 100 that permit dense, neuron-like arrangement in a compact size.

As an example of the application of the BSE 100, multiple BSEs 100 may be assembled in an efficient arrangement whereby some number of BSEs 100 are located adjacent to another BSE 100. An example of this is one in which six (6) BSEs 100 surround a "polar" BSE 100 of substantially the same size. Thus, seven cones may be nested, allowing for short optoelectronic connections between the polar cone and its neighbors, and, in part, permits simultaneous data processing through an abundance of parallel channels, and alleviates the bus limitations inherent in conventional computers. A plurality of such seven-BSE assemblies can subsequently be joined together and interconnected to form a spherical configuration, where each BSE 100 is surrounded by six (6) other BSEs, as shown in FIGS. 4 and 5 and discussed below.

Figure 5:
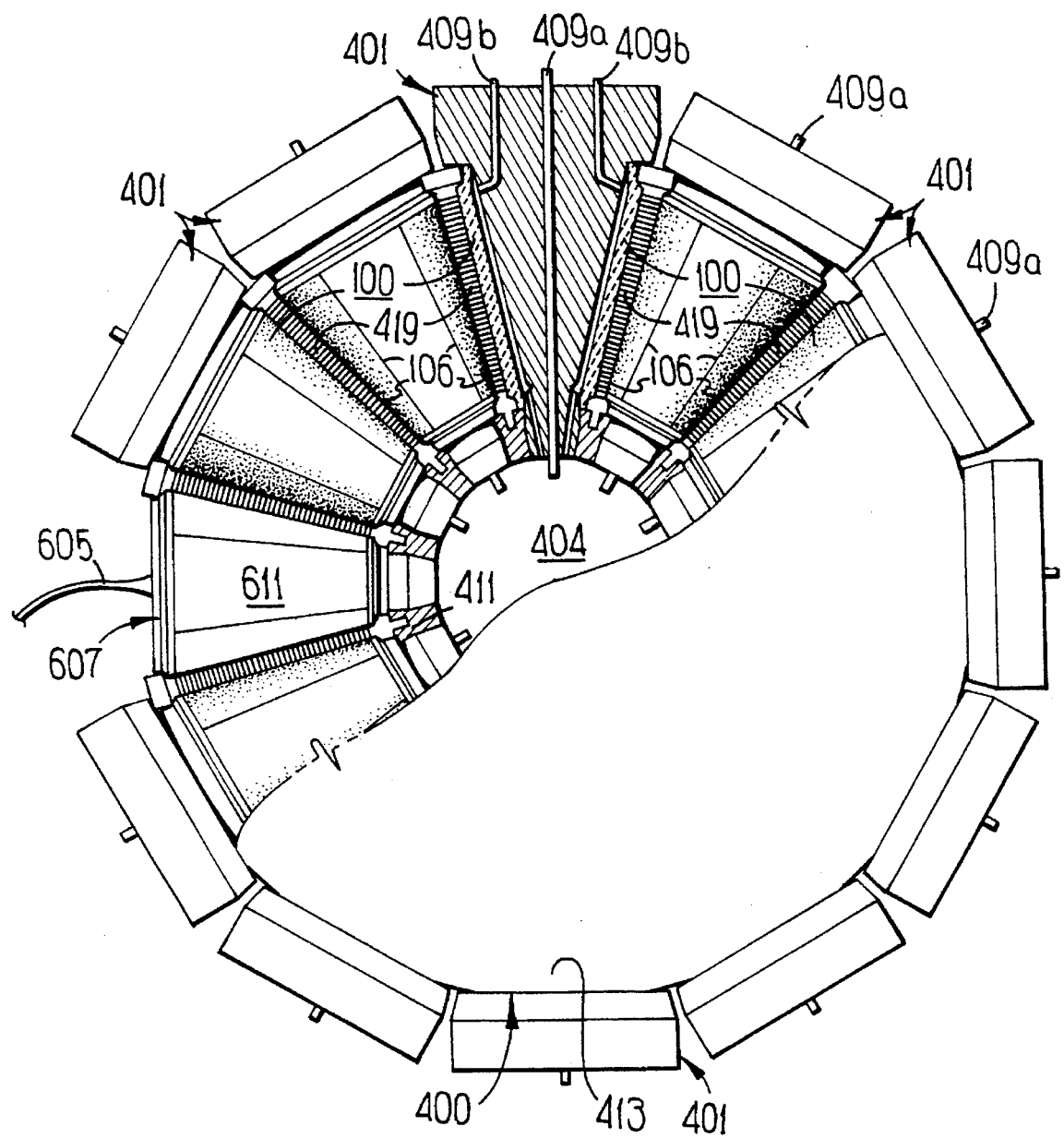
FIG. 5 shows a spherical assembly of BSEs, optical interconnections, system of cooling and power supply.

FIG. 4 depicts a side view partial cut-away and cross-section of the major components of one BSE 100. Particularly, FIG. 4 shows a single BSE 100, which may be connected to other BSEs 100 as described above. However, BSE 100 may also be utilized by itself apart from other BSEs 100, although the inter-BSE communication features of the present invention may not be realized in this configuration. However, for purposes of explanation, the BSE 100 of FIG. 4 will be discussed in conjunction with the spherical configuration. Additionally, it will readily be understood that other configurations of BSEs may be implemented as well.

Referring to FIG. 4, each BSE 100 has its own power supply 401, designed and optimized to suit its particular requirements. Power supply 401 is designed to fit into the internal space of the BSE 100 in a male-female arrangement, where power supply 401 forms the male component and the hollow interior of BSE 100 forms the female component.

The hollow shape of each BSE 100 provides for a more highly effective method of cooling. In one embodiment, coolant at a relatively high pressure is transferred into power supply 401 at inlet 409a, through tubular conduits 403 inside power supply 401, into the core 404 of the spherical assembly 400, and is redirected into the space between the interior surfaces of the non-planar BSE substrata 104 (also shown in FIGS. 3a, 3b and 3c) and the exterior surface 407 of power supply 401 on its return. The coolant then passes out of power supply 401 at exit 409b. This allows simultaneous cooling of BSE 100 and power supply 401 at surfaces 471. Conduits 403 may also be directed into other parts of the overall system which require heat dissipation.

When the BSEs 100 are in a spherical, or equivalent, arrangement, shown in FIG. 4, and more clearly in FIG. 5, the surface 411 of internal conductive core 404 of spherical assembly 400 is designed as either the positive or negative terminal and the exterior portion (and surface) 413 of sphere 400 becomes the opposite pole. Power supply 401 provides a potential to internal portion 411 and external portion 413 via connectors to these regions. That is, because power supply 401 is designed to fit within BSE 100, one end 415 of power supply 401 makes contact with the internal portion 411 of the BSE, and the other end 417 is in contact with the exterior portion 413. Of course, other suitable means for providing power to BSE 100 may be utilized. The power provided to BSE 100 from power supply 401 is ultimately provided to any electronic circuitry residing on semiconductor layer 306 via connections 411a and 413a to semiconductor layer 306.

Referring again to FIG. 4, radial interface lines 106, previously discussed, may run along the length of each BSE 100 from the negative to the positive pole, and serve to allow communications between different BSEs. Each radial interface line 106 may include numerous pockets 312 (previously discussed, but not specifically shown in FIG. 4) which include a photoemitting cell 301 and a photoreceiving cell 302 for transmitting signals away from, and to, the components on semiconductor layer 306 of BSE 100. A fiber optic interconnector 419 may be utilized which contains two-way fiber optic lines corresponding to the various pockets 312 on each radial interface line 106. In this case, fiber optic interconnector 419 would be connected between the length of neighboring BSEs 100, so that all neighboring BSEs 100 which needed to communicate among themselves would be connected. Fiber optic interconnector 419 may utilize conventional fiber optic technology known to one of ordinary skill in the art. Of course, neighboring BSEs 100 may also be interconnected without the aid of fiber optic interconnector 419, whereby the various pockets 312 on the neighboring BSEs 100 may be aligned. In this case, opposite photoemitting cells 301 and photoreceiving cells 302 on neighboring BSEs 100 would be able to communicate directly with each other.

The BSE 100 shown in FIG. 4 is also shown with other BSEs in FIG. 5 in a spherical location. Reference numerals utilized in FIG. 5 correspond to those numerals used in the other figures of the present disclosure.

Because radial interface lines 106 divide the semiconductor layer 306 of a BSE 100 into numerous areas, each BSE 100 may be designed to have the corresponding number of processing areas around its periphery. For example, when BSE 100 includes six (6) radial interface lines 106, six (6) areas on semiconductor layer 306 are delineated. In a preferred embodiment of the present invention, each processing area may have its own processor, memory, input/output registers and control circuitry, and each BSE 100 may have its own local bus for interconnection between the individual processing areas. Also, each processing area may have a channel of communication through the interface lines 106 with its neighbor BSE 100 enabling it to achieve multiprocessing. Therefore, in this example, each BSE 100 may have at the same time six channels of communication with six neighbors.

Figure 8:
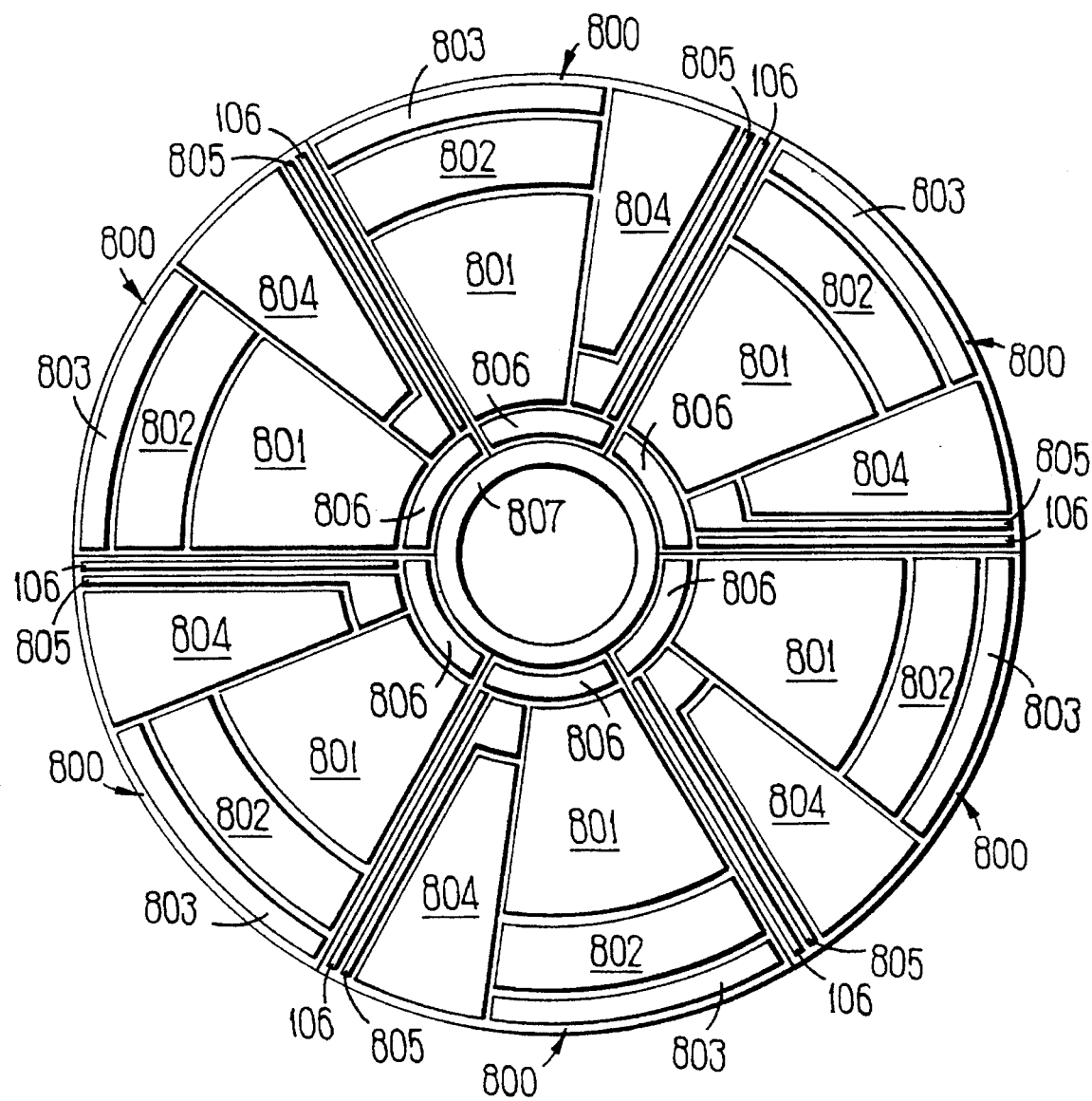
FIG. 8 shows a multiprocessor application of the present invention in a preferred embodiment.

In FIG. 8, an example of this configuration is depicted. Specifically, FIG. 8 is a block diagram of the surface layout of a BSE 100, where the surface area of the circumferential semiconductor layer 306 is shown in two dimensions. Referring to FIG. 8, several general components are shown within each area 800 delineated by radial interface lines 106: random access (read/write) memory (RAM) 801, read only memory (ROM) 802, input/output (I/O) registers 803, microprocessor 804, multiplexor 805 between microprocessor 804 and radial interface line 106 and/or local ring bus 807 and radial interface line 106, local bus access controller 806 for controlling access to local ring bus 807, and of course, radial interface lines 106. Local ring bus 807 connects the various areas 800. Each area 800 represents the general elements of a multi-purpose computing environment, as generally known in the art. The combination depicted represents merely one of many uses for which semiconductor layer 306 could be put, and is shown merely for purposes of example.

In operation, microprocessor 804 may act upon RAM 801, ROM 802 and I/O registers 803 according to common principles known in the computer hardware art. Local ring bus 807 may serve as a bus for interconnecting each area 800, and multiplexor 805 serves as an interface between either microprocessor 804 and radial interface line 106 and/or local ring bus 807 and radial interface line 106. Local bus access controller 806 serves to control access to local ring bus 807 by multiplexor 805.

As is evident from FIG. 8, multiple microprocessors 804 and support circuitry may be utilized in accordance with the present invention, allowing for the support of parallel processing. Each microprocessor 804 may accordingly be programmed according to various principles to take advantage of this parallel processing environment. Through the use of the multiple microprocessor 804 located on each BSE 100, as well as the other microprocessors 804 on other BSEs 100, a highly parallel operating environment can be achieved. Communication between the various areas 800 can be achieved through radial interface lines 106, as previously described.

The present invention is not limited to the configuration specifically shown in FIG. 8, and other conventional semiconductor devices, such as analog amplifiers and generators, registers, memory chips and processors based upon TTL, MOS, CMOS or other technologies may be incorporated into semiconductor layer 306. Additionally, devices using newer technologies based on the properties of the Quantum Well (QW) and Multiple Quantum Well (MQW) structures, as well as virtually any other type of device, may be implemented.

The BSE 100 of the present invention is also not limited to the specific configurations previously discussed. As shown in FIGS. 6 and 7, a more advanced concept for developing a BSE 100 uses a transparent substrata 601 onto which the semiconductor monocrystal silicon layer shell 603 is grown. In this case, communication elements, such as optic fibers 605, are built into the terminator 609 (i.e. the surface in contact with the transparent substratum 601), and additional communication elements and all other circuitry are located on the outer surface of the silicon layer 603. This will allow one BSE 100 to accept and generate light signals from/to external sources through the transparent cone substrate 601 as well as to receive and transmit light signals from/to other BSE units.

In particular, FIG. 6 shows an active optical interconnector 607, which consists of a passive fiber optic cable 605 with a male cone shaped terminator 609 on each end of the fiber optic cable 605. On the outside surface of silicon layer 603 are active, bi-directional female optical amplifiers 611, a cross-section of which is shown in various parts of FIG. 6 as A—A. The optical amplifiers 611 may consist of two MQW semiconductor surface-emitting laser amplifiers (613 and 615) for each optic input/output fiber (one of which may be in the shape of a solid cylinder, and the other of which may surround the first cylindrical amplifier). Output laser amplifier 613 amplifies and transmits optical signals from fiber optic cable 605 to the terminator assembly 609. The amplified optical signals from output laser amplifier 613 are supplied to fiber optic interconnector 419, in a manner similar to fiber optic interconnector 419 shown in FIG. 4. Input laser amplifier 615, having the form of a hollow cylinder surrounding output laser amplifier 613, amplifies and transmits optical signals from fiber optic interconnector 419, through the terminator assembly 609 assembly to the fiber optic cable 605.

Because surface-emitting laser amplifiers 613 and 615 require little power compared to the lasers of previously described BSEs 100, optical interconnector 607 requires much less power overall than a BSE 100. For this reason, optical interconnector 607 need not include a power supply in its internal cavity, but instead may utilize the power provided by positive and negative terminals 413 and 411 (shown in FIGS. 4 and 5).

In a preferred embodiment, the external diameter of input laser amplifier 615 may be slightly smaller than the diameter of a fiber of fiber optic cable 605 so that all energy of the optic beam transmitted by cable 605 is received by the input laser amplifier 615, which in turn may be transmitted to the receiver 302 of a neighboring BSE 100. When inter-BSE communications are to be performed, one of the BSEs 100 connected to other BSEs, discussed previously, may be replaced by a bi-directional female optical amplifier 611, to accept the male cone terminators 609. As with the BSEs 100 discussed previously with respect to the other figures, the cone shaped terminators 609 may take the form of other shapes.

A male cone terminator 609 and accompanying fiber optic cable 605, as well as other related components, are depicted along with a plurality of BSEs 100 in a spherical configuration in FIG. 5, previously discussed.

As an application of the improved semiconductor technology discussed above, the present invention may be utilized in a device which is capable of accepting visual information in a manner very much like the eye of an animal. This application will now be discussed with reference to FIG. 7.

The device described below, hereinafter called the "Eye" is an assembly of conic BSEs Which have the capabilities to receive and process visual signals similar to an animal eye. The device can be used as a video camera with capabilities greatly enhanced beyond any existing today. The technology also appears to be well suited for robotics control applications.

Figure 7A:
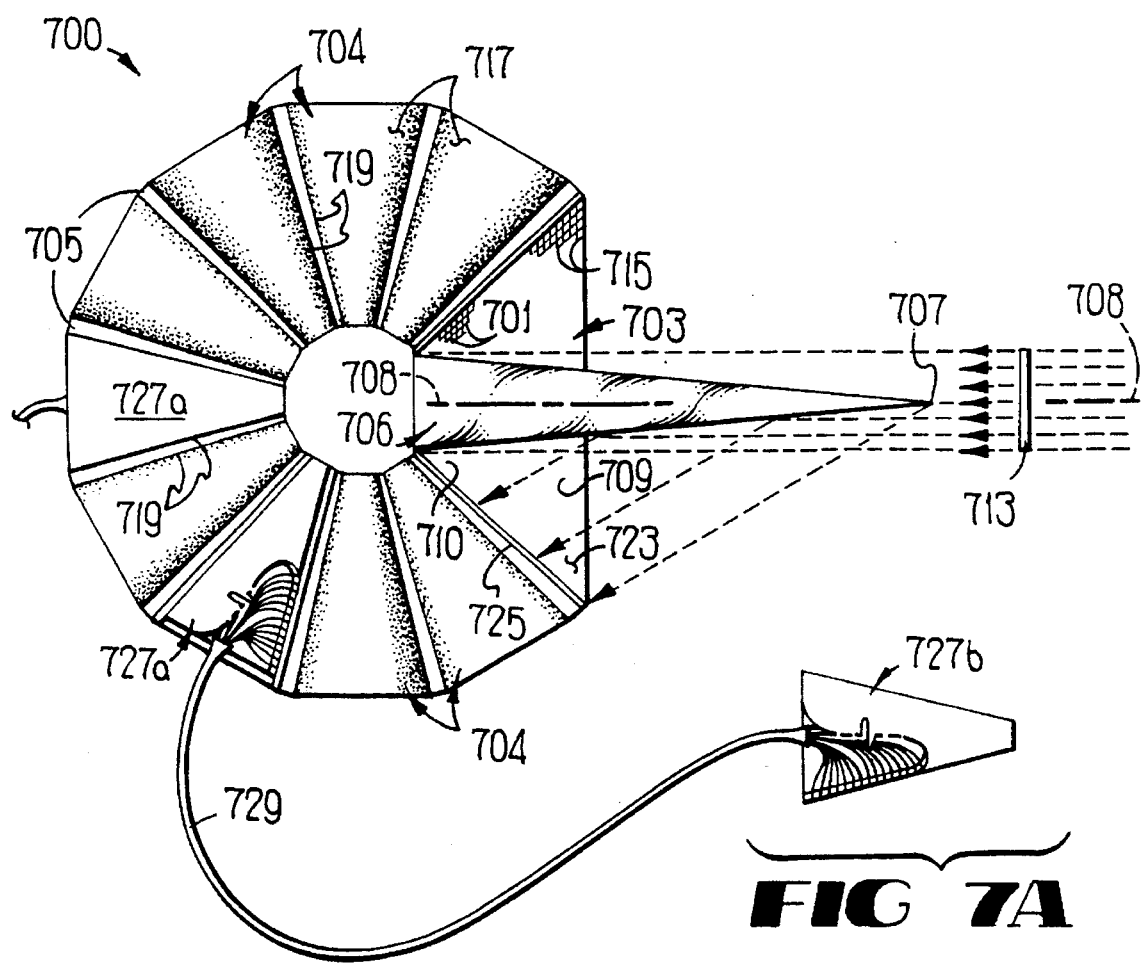
FIGS. 7a and 7b show a visual information gathering application of the present invention in a preferred embodiment.
Figure 7B:
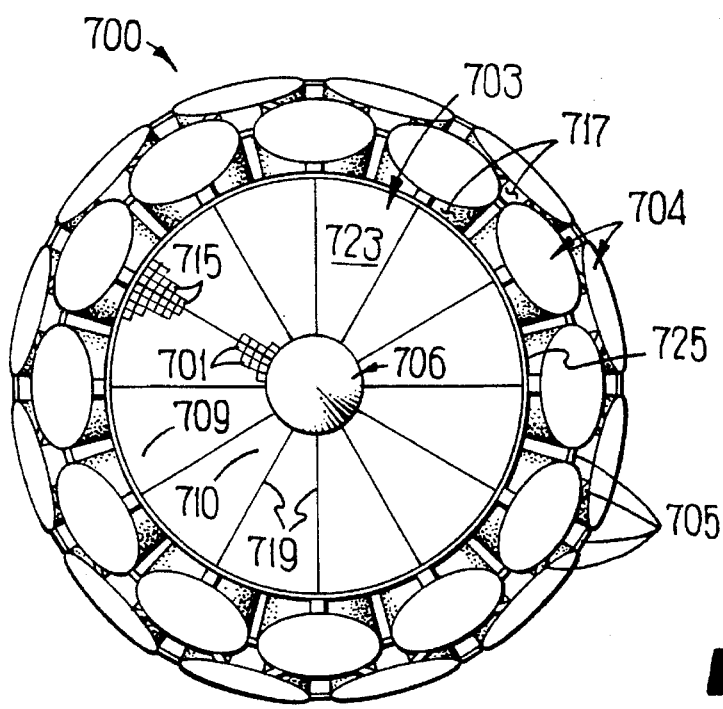

FIGS. 7a and 7b depict a side view and a front view of the "Eye", respectively. The primary photosensitive elements 701 of the "Eye" 700 are fabricated on the surface of a transparent broad angle cone substrate 703, and function as a "retina" for the device. The broad angle cone 703 is surrounded by conventional normal angle cones 704, comprising BSEs, separated and interconnected by fiber optic connectors 705. A cone shaped mirror 706, located inside the retina 703, reflects light signals received from external sources onto the retina 703. The larger base of the cone shaped mirror 706 is located at the smaller end of broad angle cone substrate 703, while the other end of cone shaped mirror 706 extends away from substrate 703 and ends in a point at 707. The cone shaped mirror 706 reflects light from objects located close to the optic axis 708 of the "Eye" onto the outer portion 709 of the retina 703, and light from objects located more distant from the axis 708 is reflected onto the inner portion 710 of the retina 703. Because of a greater angle density of photosensitive elements (forming "pixels" or picture elements, along the surface of retina 703) in the outer portion 709 of the retina 703, the "Eye" will "see" objects located closer to the optic axis 708 more clearly. In addition to the cone shaped mirror 706, it is also possible to use a type of refractive optic device such as a lens designed to a special shape. Many other types of devices may be used, as well, in order to focus visual information onto retina 703.

A special R-G-B matrix filter 713 may be mounted in front of the cone mirror 706 or lens. The filter 713 only allows penetration and passage of RED, GREEN or BLUE components of light, which are projected by the mirror 706 onto certain retinal sensitive elements 715. This mechanism will allow the creation of color vision for the "Eye"; that is, the "Eye" will be able to detect the presence of various colors.

Binary values received from the photosensitive elements 701 and 715 (corresponding to the various pixels of retina 703) are loaded into shifting registers (not specifically shown) by the external data processing layer 717 of the retina 703. The data may then further be transferred to an active bi-directional optical amplifier along a radial interface line 720 (similar to a radial interface line 106 previously discussed) by a transmitting element (such as output laser amplifier 613, shown in FIG. 6, and also previously described) of a BSE located within data processing layer 717. Such data may then be transferred to terminator 727a through fiber optic cable 729, to terminator 727b, and to other BSEs (not specifically shown) for further processing.

After the last pixels from retina 703 are transmitted through the radial interface line 719, new values from the photosensitive elements may be captured in the shifting registers, and the process is repeated.

Visual data, after being transmitted through the radial interface lines 719 of retina 703, disappear from the internal surface 723 of the retina 703 and reappear on the external surface 725 of the retina 703. Each BSE cone 704 that surrounds the retina 703 may carry out low level processing of the visual information produced in one segment of the retinal surface 703. A higher level of data processing may be performed by BSE cones in layers even further from retina 703. This processing may be performed by conventional computer circuitry, such as those depicted in FIG. 8, or other types of processing circuitry, and may includes various types of conventional visual processing algorithms such as those listed below:

a. High frequency filtration (to reduce noise).

b. Level-control circuits operation (to operate retinal level of sensitivity).

c. ON and OFF receptors (to detect areas where luminance has been changed).

d. Border detectors to detect borders between light and shadows or between different colors.

e. Focusing of optical system.

f. Luminance control, etc.

As was indicated previously, inter-BSE communication is achieved by special circuits located on the surface of the cone that detect, amplify and generate light signals. Similarly, as also shown in FIG. 7a, specially designed cones 727a and 727b located on both ends of a fiber optic cable 729 may serve to interconnect and network two spherical "Eye" assemblies 700. Specifically, cones 727a and 727b at either end of the fiber optic cable 729 can be "plugged" into different devices to permit inter-device communications.

What has been described above are preferred embodiments of the present invention. It is of course not possible to describe every conceivable combination of components for purposes of describing the present invention, but one of ordinary skill in the art will recognize that many further combinations and permutations of the present invention are possible. All such possible modifications are to be included within the scope of the claimed invention, as defined by the appended claims below.

I claim:

1. A semiconductor element assembly comprising:

(a) a non-planar substrate including a plurality of substrata, wherein said plurality of substrata are interconnected to form a cavity;

(b) a semiconductor material coupled to said non-planar substrate, said semiconductor material including a plurality of integrated circuits interconnected for communication; and (c) an operation supporting means for supporting the operation of the semiconductor element assembly, wherein said operation supporting means is disposed within said cavity.

2. The semiconductor element assembly of claim 1, wherein said non-planar substrate is substantially curved.

3. The semiconductor element assembly of claim 1, wherein said non-planar substrate is substantially conical.

4. The semiconductor element assembly of claim 1, wherein the said non-planar substrate is substantially frustoconical.

5. The semiconductor element assembly of claim 1, wherein said non-planar substrate is substantially spherical.

6. The semiconductor element assembly of claim 1, wherein said non-planar substrate includes a three-dimensional surface connecting two circles residing in different parallel planes.

7. The semiconductor element assembly of claim 1, wherein said operation supporting means comprises a cooling means for cooling the semiconductor element assembly.

8. The semiconductor element assembly of claim 1, wherein said operation supporting means comprises a power supply means for providing power to the semiconductor element assembly.

9. The semiconductor element assembly of claim 1, wherein said operation supporting means comprises a coolant conduit means travelling through a power supply means and abutting said non-planar substrate, wherein said coolant conduit means contains a fluid coolant for cooling the semiconductor element assembly.

10. The semiconductor element assembly of claim 1, further comprising:
   (d) at least one electronic circuit fabricated on said semiconductor material.

11. The semiconductor element assembly of claim 1, wherein said non-planar substrate comprises a material selected from the group consisting of a ceramic material, a pure carbon, and a silicon dioxide.

12. The semiconductor element assembly of claim 11, wherein said non-planar substrate comprises silicon dioxide which is doped to match the lattice structure of said semiconductor material.

13. The semiconductor element assembly of claim 1, wherein said semiconductor material comprises a first semiconductor layer composed of GaAs.

14. The semiconductor element assembly of claim 13, wherein the thickness of said GaAs layer is in the range of 50–200 Angstroms.

15. The semiconductor element assembly of claim 13, wherein said semiconductor material further comprises a second semiconductor layer composed of materials selected from the group consisting of Si and GaAs.

16. The semiconductor element assembly of claim 1, further comprising:
   (d) transmitting means coupled to said semiconductor material for transmitting signals from said semiconductor material to a destination external to said semiconductor material.

17. The semiconductor element assembly of claim 16, wherein said transmitting means transmits light signals.

18. The semiconductor element assembly of claim 16, wherein said transmitting means comprises an edge-emitting laser.

19. The semiconductor element assembly of claim 16, wherein said transmitting means comprises a surface-emitting laser.

20. The semiconductor element assembly of claim 19, wherein said surface-emitting laser includes a cone-shaped beam splitter.

21. The semiconductor element assembly of claim 16, wherein said transmitting means further comprises a mirror for reflecting the signals from said transmitting means.

22. The semiconductor element assembly of claim 1, further comprising:
   (d) receiving means coupled to said semiconductor material for receiving signals from a source external to said semiconductor material and providing the signals to said semiconductor material.

23. The semiconductor element assembly of claim 22, wherein said receiving means receives light signals.

24. The semiconductor element assembly of claim 22, wherein said receiving means comprises a photo-sensitive element.

* * * * *